United States Patent
Yan et al.

(10) Patent No.: US 8,587,019 B2
(45) Date of Patent: Nov. 19, 2013

(54) GROOVED PLATE FOR IMPROVED SOLDER BONDING

(75) Inventors: Xiantao Yan, Palo Alto, CA (US); Debo A. Adebiyi, Fremont, CA (US); Zequn Mei, Fremont, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 13/270,646

(22) Filed: Oct. 11, 2011

(65) Prior Publication Data

US 2013/0087813 A1   Apr. 11, 2013

(51) Int. Cl.
*H01L 33/00* (2010.01)

(52) U.S. Cl.
USPC .............. 257/99; 257/76; 257/98; 438/106; 438/113; 438/122

(58) Field of Classification Search
USPC ........................................... 257/99; 438/122
See application file for complete search history.

(56) References Cited

U.S. PATENT DOCUMENTS

| | | | |
|---|---|---|---|
| 6,008,541 A | 12/1999 | Park et al. | |
| 7,033,864 B2 | 4/2006 | Libres et al. | |
| 7,102,239 B2 | 9/2006 | Pu et al. | |
| 7,723,620 B2 | 5/2010 | Kawade et al. | |
| 2005/0085007 A1* | 4/2005 | Vu et al. | 438/106 |
| 2006/0038188 A1 | 2/2006 | Erchak et al. | |
| 2007/0086188 A1* | 4/2007 | Raos et al. | 362/249 |
| 2009/0236729 A1* | 9/2009 | Fann et al. | 257/692 |
| 2011/0094787 A1* | 4/2011 | Lai et al. | 174/262 |

FOREIGN PATENT DOCUMENTS

| | | | |
|---|---|---|---|
| JP | 08-153752 A | 6/1996 | |
| JP | 2000-294589 A | 10/2000 | |
| JP | 2008-311417 | * 12/2008 | |
| JP | 2009-94213 | * 4/2009 | |

OTHER PUBLICATIONS

Fujino et al., JP 200994213, Apr. 30, 2009 (Machine translation on Nov. 1, 2012).*
Uematsu et al., JP 2008311417, Dec. 25, 2008 (Machine translation on Nov. 2, 2012).*

* cited by examiner

*Primary Examiner* — Kyoung Lee
(74) *Attorney, Agent, or Firm* — Kilpatrick Townsend & Stockton LLP

(57) ABSTRACT

A metal plate on a multi-die LED emitter substrate or a metal plate on a metal-core printed circuit board (MCPCB) that attaches to the emitter substrate (or both plates) can be fabricated with a number of generally radial grooves, at least some of which extend to the peripheral edge of the plate. These grooves can provide channels that allow air to escape during solder-bonding processes, reducing the size and/or total area of solder voids and thereby improving thermal transfer between the emitter and the MCPCB.

26 Claims, 6 Drawing Sheets

GROOVED PLATE FOR IMPROVED SOLDER BONDING

BACKGROUND

The present disclosure is related to connecting components, and in particular to providing a grooved metal plate to reduce solder voids when components are soldered together.

Lighting devices systems based on light-emitting diodes (LEDs) are of considerable interest. In some lighting devices, multiple LED dies are mounted on a single substrate and electrically connected to each other to form an emitter. In operation, an emitter can generate considerable heat, which needs to be transferred away to protect the LEDs from damage due to overheating. Emitters have been fabricated, e.g., by LedEngin, Inc., assignee of the present application, with a large metal plate on the bottom of the substrate to facilitate heat transfer. The emitter substrate is typically mounted on a supporting surface, such as a metal-core printed circuit board (MCPCB) that has a large metal plate to match the one on the emitter. The two plates can be soldered together to provide heat transfer from the emitter into the MCPCB, and heat from the MCPCB can be further transferred to a heat sink.

SUMMARY

As emitters become larger to include more LED dies, the metal plates on the bottom surface and matching plates on the MCPCB also generally need to be larger to provide effective heat transfer. With the increased area comes increased difficulty in soldering the plates together, as the solder does not necessarily heat or spread evenly. In some instances, large pockets of air can be created between the plates. Since air is significantly less effective as a thermal conductor than typical solder metals (tin, etc.), solder voids can result in uneven temperature distributions across the surfaces of the plates, leading to much higher thermal resistance at the emitter/MCPCB interface and/or to warping and damaging of the emitter substrate.

According to certain embodiments of the present invention, the metal plate on the emitter or the MCPCB (or both) can be fabricated with a number of generally radial grooves, at least some of which extend to the peripheral edge of the plate. These grooves can provide channels that allow air to escape during solder-bonding processes (e.g., standard reflow and/or hot-plate processes), reducing the size and/or total area of solder voids and thereby improving thermal transfer between the emitter and the MCPCB.

Certain aspects of the present invention relate to a printed circuit board for bonding to an emitter substrate supporting light-emitting devices. The printed circuit board, which can be a metal-core printed circuit board, includes at least a first insulating layer and a metal plate on a top surface of the first insulating layer. The metal plate, which can be circular or have other shapes, has multiple grooves therein; at least some of the grooves have an inner end at a first distance (which can be but is not necessarily zero) from a center of the metal plate and an outer end at a peripheral edge of the metal plate.

The board can be a multilayer structure; accordingly, a second insulating layer can be parallel to and below the first insulating layer, and at least one patterned layer of conductive material can be disposed between a bottom surface of the first insulating layer and a top surface of the second insulating layer, providing routing for electrical connections between different parts of the board. Metal contact pads can be disposed on the top surface of the first insulating layer, and at least one of the metal contact pads can be electrically connected to the conductive material of the patterned layer.

In some embodiments, all of the grooves need extend to the peripheral edge, but in other embodiments this is not the case. For instance, at least one of the grooves can have its inner end at the center of the metal plate and its outer end at a second distance from the center, with the second distance is being less than a distance from the center of the metal plate to the peripheral edge of the metal plate. This second distance can be the same as, less than, or greater than, the first distance.

Certain aspects of the present invention relate to an emitter for a light-emitting device. The emitter can include an emitter substrate having a top surface adapted to support a plurality of light-emitting diodes and a bottom surface. A metal plate (which can be circular or have other shapes) can be disposed on the bottom surface of the emitter substrate, and this plate can have grooves formed therein. At least some of the grooves have an inner end at a first distance (which can be but is not necessarily zero) from a center of the metal plate and an outer end at a peripheral edge of the metal plate.

Certain aspects of the present invention relate to a light-emitting device that has a printed circuit board having a first insulating layer and a first metal plate on a top surface of the first insulating layer, an emitter substrate having a top surface holding a plurality of light-emitting diodes and a bottom surface having a second metal plate thereon, and a solder layer disposed between and bonded to the first metal plate and the second metal plate. The first and second plates can be the same size and shape (e.g., circular). One or the other (or both) of the first and second metal plates can have a plurality of grooves therein, with at least some of the grooves having an inner end at a first distance (which can be but is not necessarily zero) from a center of the first metal plate and an outer end at a peripheral edge of the first metal plate.

The following detailed description together with the accompanying drawings will provide a better understanding of the nature and advantages of the present invention.

BRIEF DESCRIPTION OF THE DRAWINGS

FIG. 3A is a simplified bottom view of a solder joint between a metal plate on an LED emitter and a corresponding metal plate of a conventional MCPCB, and FIG. 3B is a corresponding view of a solder joint between a metal plate on an LED emitter and a corresponding metal plate of an MCPCB with grooves according to an embodiment of the present invention.

DETAILED DESCRIPTION

According to certain embodiments of the present invention, a metal plate on a multi-die LED emitter substrate or a metal plate on a metal-core printed circuit board (MCPCB) that attaches to the emitter substrate (or both plates) can be fabricated with a number of generally radial grooves, at least some of which extend to the peripheral edge of the plate. These grooves can provide channels that allow air to escape during solder-bonding processes (e.g., standard reflow and/or hot-plate processes), reducing the size and/or total area of solder voids and thereby improving thermal transfer between the emitter and the MCPCB.

Figure 1:
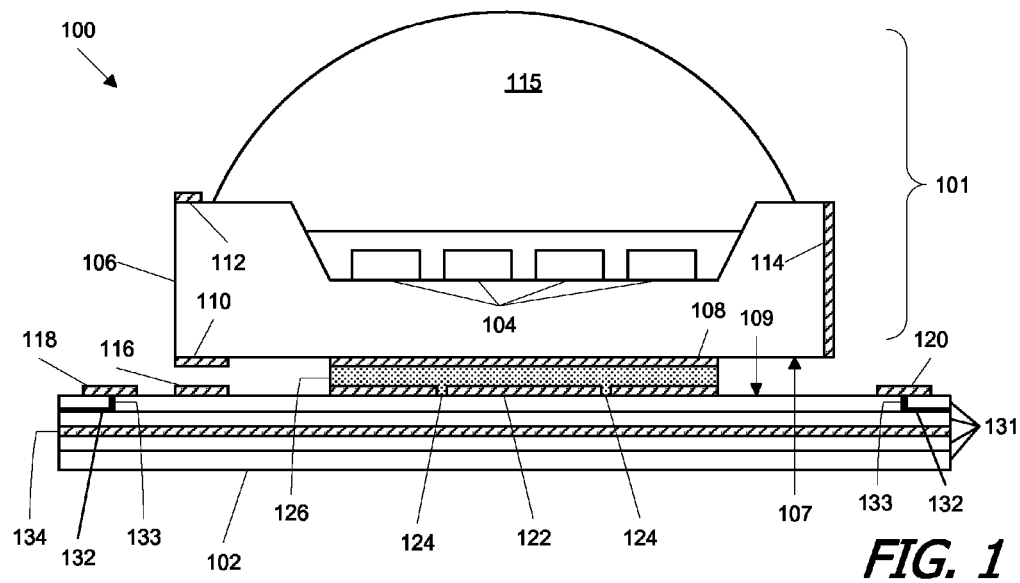
FIG. 1 is a simplified side cross-section view illustrating a light source assembly according to an embodiment of the present invention.

FIG. 1 is a simplified side cross-section view illustrating a light source assembly 100 according to an embodiment of the present invention. An LED emitter 101 is mounted on a metal-core printed circuit board (MCPCB) 102. LED emitter 101 includes a number of LED dies 104 disposed on an emitter substrate 106. On a bottom surface 107 of substrate 106 is a large circular metal plate 108. The metal of plate 108 can include aluminum, aluminum alloy, other metals or metal alloys, or a multilayered stack of different metals or metal alloys. In some embodiments, the primary purpose of plate 108 is to transfer heat from emitter 101 to MCPCB 102, and the materials for plate 108 may accordingly be chosen based on thermal properties.

Other electrical contacts 110, 112, 114 can be provided on bottom, top, and/or side surfaces of emitter substrate 106. (While three contacts are shown for illustrative purposes, it is to be understood that the number and location of electrical contacts can be selected as desired.) Emitter substrate 106 is advantageously configured to provide conductive paths (not shown) between contacts 110, 112, 114 and LED dies 104. Such paths may be on the surface and/or internal to emitter substrate 106; for example, emitter substrate 106 can have a layered structure in which patterned conductive layers alternate with insulating layers. Emitter 101 can also include other components, such as a primary lens 115 disposed over LED dies 104. The particular structure of emitter 101 is not critical to understanding the present invention.

MCPCB 102 has a top surface 109 on which are provided various electrical contacts 116, 118, 120 to connect to contacts 110, 112, 114 of emitter substrate 106. These contacts can be made of aluminum, aluminum alloys, other metals or metal alloys, or any other electrically-conductive material. Electrical connections between MCPCB contacts 116, 118, 120 and emitter contacts 110, 112, 114 are not explicitly shown, but connections can be provided using conventional techniques such as solder bonding, wire bonding, or the like.

MCPCB 102 advantageously provides conductive paths between contacts 116, 118, 120 and peripheral contact locations (not shown), allowing assembly 100 to be electrically connected into a larger electronic device, such as a lamp that may include one or more copies of assembly 100. For example, MCPCB 102 can be a multilayer structure in which layers 131 of insulating material (e.g., a dielectric polymer) are printed with metal patterns 132 to provide conductive pathways, after which the layers are fused together into a single board. Conductive vias 133 can be formed in the board (e.g., by making holes through one or more and filling or lining the holes with metal) to electrically connect pathways in different layers. To facilitate thermal transfer and heat spreading, MCPCB 102 can include a metal core layer 134 (e.g., an aluminum alloy or the like), and the insulating material can be chosen to have high thermal conductivity; suitable constructions are known in the art. Conventional fabrication techniques can be used, and the particular details of the electrical connectivity provided by MCPCB 102 are not critical to understanding the invention.

On top surface 109 of MCPCB 102 is a large circular metal plate 122, in which one or more grooves 124 are present; grooves 124 are described further below. Metal plate 122 can be approximately the same shape and size as metal plate 108 on emitter substrate 106. The metal of plate 122 can include aluminum, aluminum alloy, other metals or metal alloys, or a multilayered stack of different metals or metal alloys. In some embodiments, the primary purpose of plate 122 is to transfer heat from emitter 101 into MCPCB 102, and the materials for plate 122 may accordingly be chosen based on thermal properties.

Solder material 126 bonds metal plate 122 to metal plate 108 and may wholly or partially fill grooves 124. Solder material 126 can be a conventional solder and is advantageously chosen to have high thermal transfer efficiency.

It will be appreciated that the emitter and MCPCB described herein are illustrative and that variations and modifications are possible. FIG. 1 is not intended as a scale drawing; for example, the metal plates and solder material may be thinner (or thicker) than shown relative to the thickness of the emitter or MCPCB. The number and placement of electrical contacts can be varied from that shown. The particular conductive pathways provided by emitter substrate 106 and MCPCB 102 are not shown, and it is to be understood that the details of such pathways are not critical to the present invention. Large metal plates 108 and 122 can be of any size desired, and the size can be determined based on the emitter design. For example, plates 108 and 122 can be circular with a diameter of, e.g., 6 mm or 8 mm; both plates can be the same or nearly the same size. Larger or smaller plates can also be used In some embodiments, plates 108 and 122 are used solely for heat transfer and need not be electrically connected to any other structure. If desired, however, plates 108 and 122 can be electrically connected to other structures, e.g., to provide for a ground connection.

Figure 2:
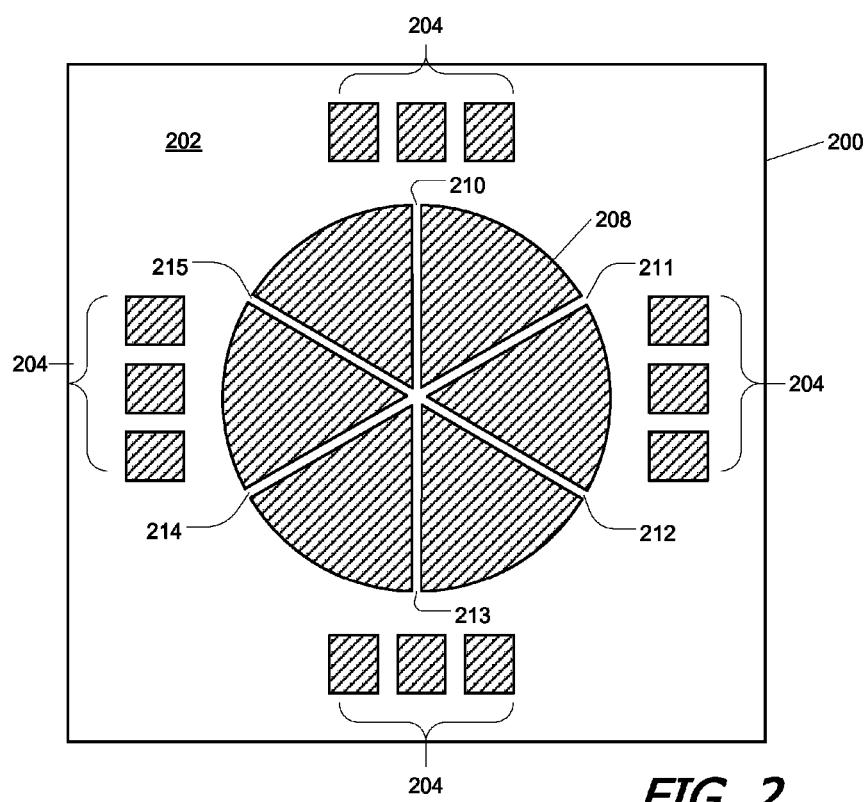
FIG. 2 is a top view of a metal-core printed circuit board (MCPCB) according to an embodiment of the present invention.

FIG. 2 is a top view of an MCPCB 200 (e.g., implementing MCPCB 102) according to an embodiment of the present invention. As described above, MCPCB 200 can include one or more layers of patterned conductors sandwiched between insulating layers; conventional techniques can be used to fabricate these layers. Top surface 202 provides various metal contacts (or pads) 204 and a larger circular metal plate 208 with radial grooves 210-215.

Grooves 210-215 are radial (or approximately radial); that is, each groove has an inner end at or near the center of plate 208, and an outer end at or near the peripheral edge of plate 208. In this particular example, the inner ends of grooves 210-215 are at the center of plate 208, so grooves 210-215 meet. The outer ends extend to the peripheral edge of plate 208. In the example shown, plate 208 is planar and has uniform thickness (within manufacturing tolerance), and grooves 210-215 are as deep as plate 208 is thick, so that the insulating material of top surface 200 of MCPCB 102 is exposed. In other embodiments, grooves 210-215 can be shallower than the thickness of plate 208. Grooves 210-215 can also be somewhat deeper than the thickness of plate 208; however, MCPCB 102 may have internal metal paths, and grooves 210-215 should not be so deep as to create undesired electrically conductive pathways when grooves 210-215 are filled with solder. While six radial grooves 210-215 are shown, it is to be understood that different numbers of grooves can be used. In one embodiment, grooves 210-215 are approximately 0.23 mm wide and 0.07 mm deep; the width and depth can be varied. In some embodiments, the number and width of grooves 210-215 can be chosen such that the area of grooves 210-215 is 15% or less of the area of plate 208.

Plate 208 and grooves 210-215 can be fabricated in various ways. In some embodiments, MCPCB 200 is created by printing electrically conductive metal patterns onto sheets of an electrically insulating or dielectric material, then fusing the printed sheets together to provide a multilayered circuit board; this process can be generally conventional in nature and a detailed description is omitted. In some embodiments, plate 208 can be printed without grooves onto the top sheet, and grooves 210-215 can be created by cutting or stripping away metal from the appropriate areas of plate 208 after the printed sheets are fused. Alternatively, the printed pattern for plate 208 can include grooves 210-215; this process generally results in grooves 210-215 that are as deep as plate 208 is thick.

Figure 3A:
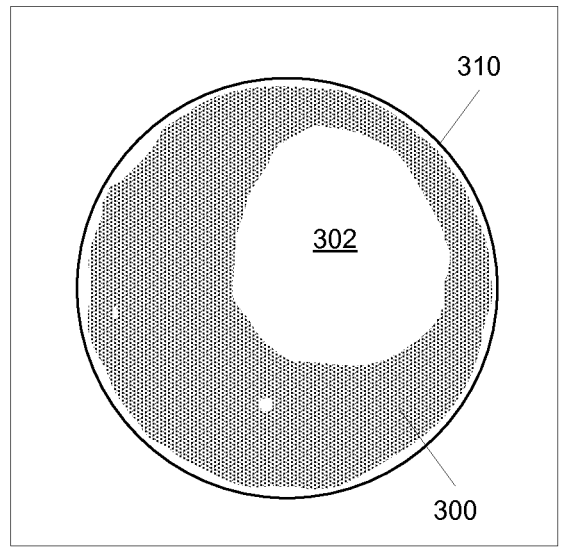
FIGS. 3A and 3B illustrate an improvement in a solder joint that can be achieved according to an embodiment of the present invention.
Figure 3B:
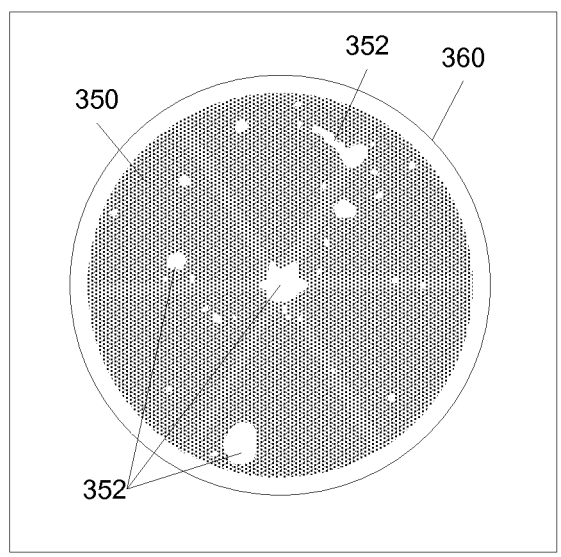

FIGS. 3A and 3B illustrate an improvement in a solder joint that can be achieved with grooves such as grooves 210-215 of FIG. 2. Shown in FIG. 3A is a simplified bottom view of a solder joint 300 between a metal plate on an LED emitter and a corresponding metal plate of a conventional MCPCB, where no grooves are provided. Circle 310 indicates the edges of the MCPCB and emitter plates. (While the drawings have been simplified in the interest of clarity, a similar view of an actual emitter-MCPCB assembly can be obtained, e.g., using x-ray imaging.) As shown, a large solder void 302 is present, occupying 20% or more of the area of solder joint 300.

Shown in FIG. 3B is a corresponding view of a solder joint 350 between a metal plate on an LED emitter and a corresponding metal plate of an MCPCB where grooves are provided on the MCPCB according to an embodiment of the present invention. Circle 360 indicates the edges of the MCPCB and emitter plates. Several small solder voids 352 are present, but each void is small and the total area of the voids is significantly reduced (to less than 15% of the joint area). As noted above with reference to FIG. 2, grooves 210-215 advantageously extend to the periphery of plate 208. It is believed that in the embodiment of FIG. 2, grooves 210-215 provide channels that allow air to escape during soldering, rather than becoming trapped and forming large solder voids.

The views shown in FIGS. 3A and 3B are illustrative. Those skilled in the art will appreciate that soldering processes have inherent variability, and not all solder joints made without grooved plates will have large solder voids. In general, as the size of the plates increases and in the absence of grooves, large solder voids tend to become more likely. Grooves as described above can significantly reduce the incidence of large solder voids. In a mass-production context, the use of grooved plates can improve yield and/or reduce the need to rework soldered parts to remove large voids, thereby improving production efficiency.

The arrangement and/or number of grooves can be varied from that shown in FIG. 2. FIGS. 4-9 provide illustrations of alternative arrangements that can be provided; it is to be understood that these examples are not exhaustive of the possibilities. In all cases, the MCPCB can be fabricated as described above and can provide electrical connectivity for an emitter as shown in FIG. 1. Also, although the illustrations in FIGS. 4-9 show only the large metal plate on the top surface of the MCPCB that is intended to be soldered to a corresponding plate of an emitter, it is to be understood that other pads and structures may be present.

Figure 4:
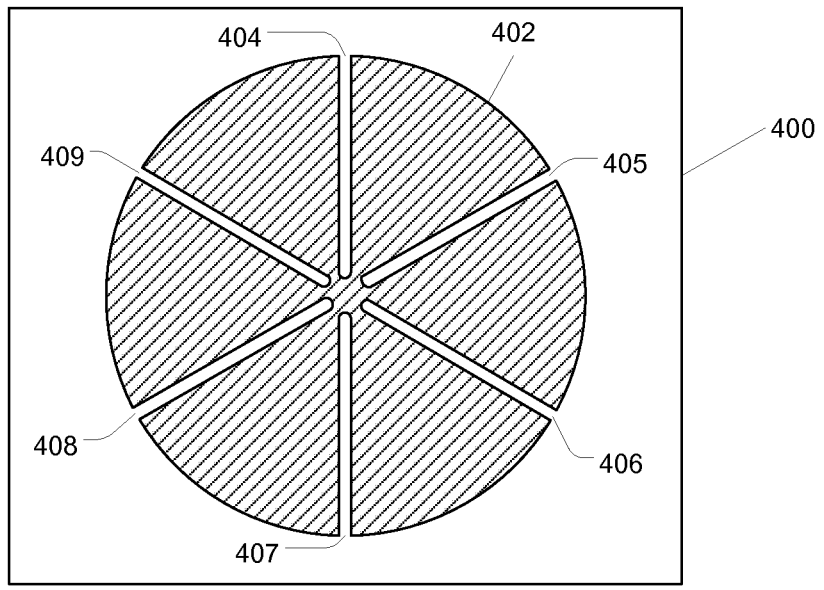
FIG. 4 is a simplified top view of an MCPCB according to another embodiment of the present invention.

In some embodiments, some or all of the grooves have their inner ends at a nonzero distance from the center of the metal plate. By way of illustration, FIG. 4 is a simplified top view of an MCPCB 400 according to another embodiment of the present invention. As shown, MCPCB 400 provides a large circular metal plate 402 with grooves 404-409. Other pads for electrical contacts can be provided (not shown). Grooves 404-409 extend to the peripheral edge of plate 402; however, unlike grooves 210-215 of FIG. 2, grooves 404-409 do not meet in the center of plate 402; the inner ends of grooves 404-409 are at a nonzero distance from the center of plate 402.

Figure 5:
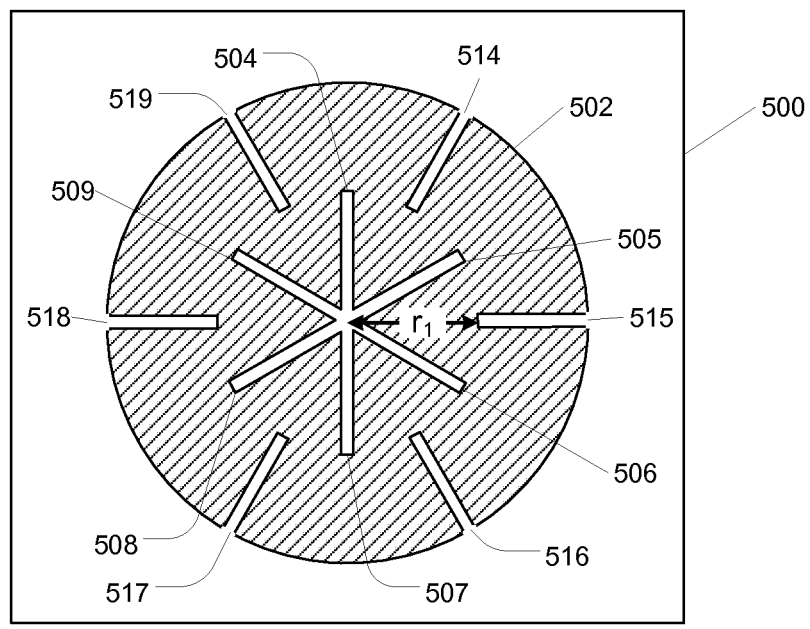
FIG. 5 is a simplified top view of an MCPCB according to another embodiment of the present invention.

In other embodiments, some of the grooves need not extend all the way to the periphery. By way of illustration FIG. 5 is a simplified top view of an MCPCB 500 according to another embodiment of the present invention. As shown, MCPCB 500 provides a large circular metal plate 502 with inner radial grooves 504-509 and outer radial grooves 514-519. The inner ends of inner radial grooves 504-509 meet in the center of plate 502 (in other embodiments, the inner radial grooves need not meet) and extend to a radius (r1) that is part way to the periphery of plate 502. For example, radius r1 can be one-half or one-third or two-thirds of the radius of plate 502. Outer radial grooves 514-519 in this example extend outward from radius r1 to the peripheral edge of plate 502 and are not aligned in the angular direction with inner radial grooves 504-509. In this configuration, it is expected that inner grooves 504-509 can channel trapped air into relatively small voids while outer grooves 514-519 allow air to escape, reducing the size of voids in the outer region.

Figure 6:
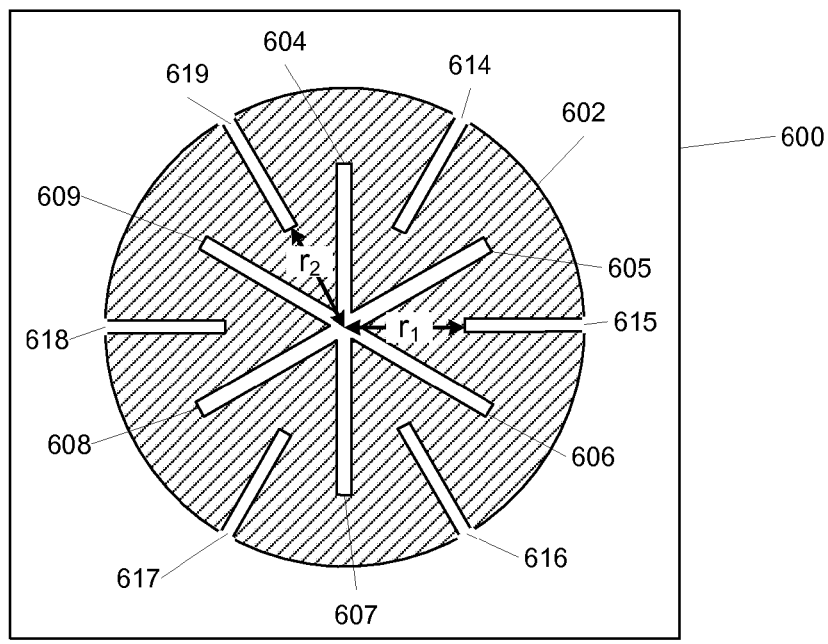
FIG. 6 is a simplified top view of an MCPCB according to another embodiment of the present invention.

In some embodiments, inner and outer grooves can overlap, in the sense that the radial distance at which the inner grooves end can be larger than the radial distance at which the outer grooves begin. FIG. 6 is a simplified top view of an MCPCB 600 according to another embodiment of the present invention. As shown, MCPCB 600 provides a large circular metal plate 602 with inner radial grooves 604-609 and outer radial grooves 614-619. Inner radial grooves 604-609 meet at the center of plate 602 and extend to a first radius (r1). Outer radial grooves 614-619 extend from a second radius (r2) to the peripheral edge of metal plate 602. In this example, r1 is larger than r2.

Figure 7:
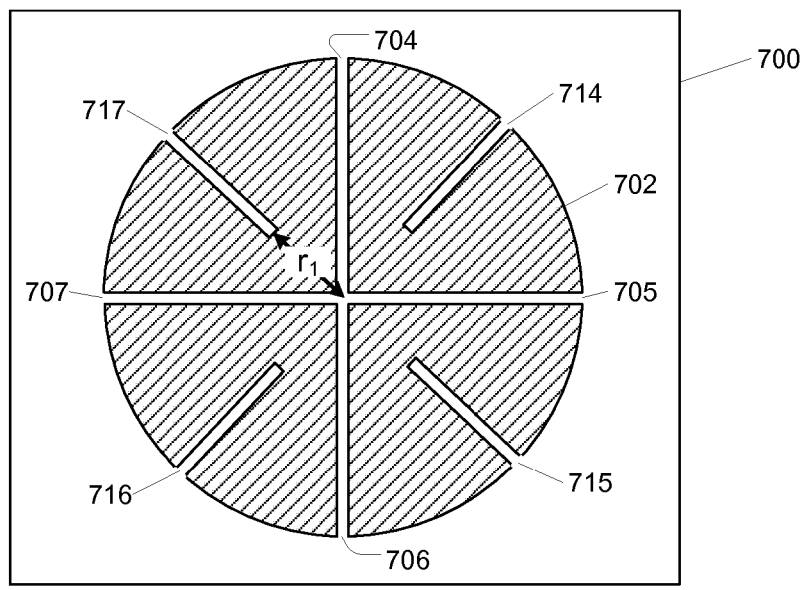
FIG. 7 is a simplified top view of an MCPCB according to another embodiment of the present invention.

In still other embodiments, some of the grooves can meet in the center while others do not. For example, FIG. 7 is a simplified top view of an MCPCB 700 according to another embodiment of the present invention. As shown, MCPCB 700 provides a large circular metal plate 702 with a first set of radial grooves 704-709 and a second set of radial grooves 714-719. Grooves 704-709 meet in approximately the center of plate 702 and in this example extend to the peripheral edge of plate 702. Grooves 714-719 are placed at intermediate angular positions between grooves 704-709 and do not meet in the center. Instead, grooves 714-719 extend from an inner radius (r2) to the peripheral edge of plate 702. This arrangement and similar arrangements can reduce the space between grooves in outer regions of the plate without creating a high density of grooves near the center of the plate; this may be particularly useful as plate size increases.

Figure 8:
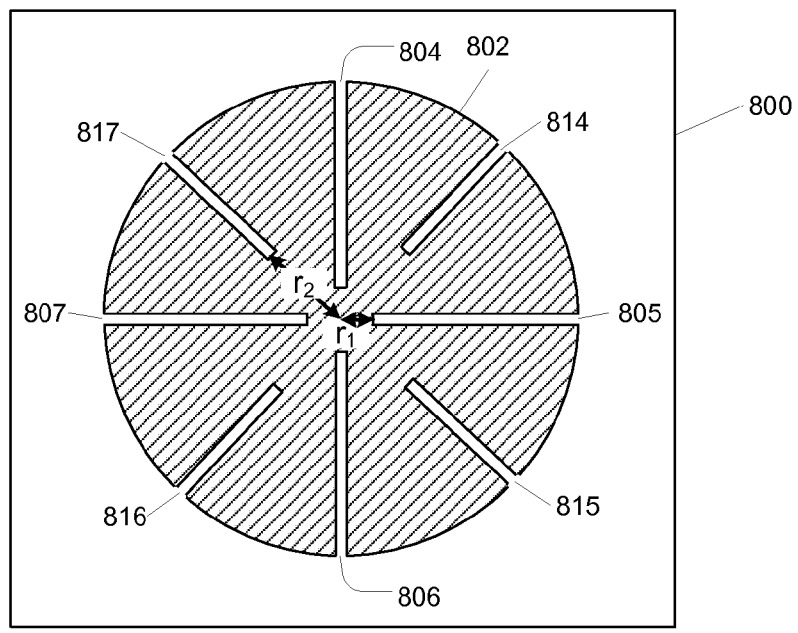
FIG. 8 is a simplified top view of an MCPCB according to another embodiment of the present invention.

In still other embodiments, radial grooves can start at different distances from the center and extend to the periphery, with no grooves meeting in the center. For example, FIG. 8 is a simplified top view of an MCPCB 800 according to another embodiment of the present invention. As shown, MCPCB 800 provides a large circular metal plate 802 with a first set of radial grooves 804-807 and a second set of radial grooves 814-817. Grooves 804-807 in this example extend from a radius r1 to the peripheral edge of plate 802. Grooves 814-817 are placed at intermediate angular positions between grooves 804-807 and extend from a radius r2 to the peripheral edge of plate 802. In this example, r2 is larger than r1, so that the inner ends of the grooves are different distances from the center. In other embodiments, r2 can be equal to or less than r1.

Figure 9:
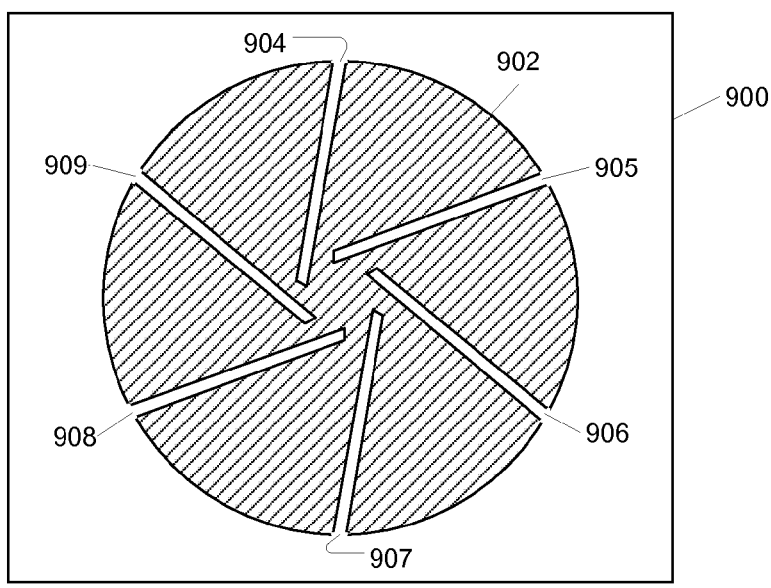
FIG. 9 is a simplified top view of an MCPCB according to another embodiment of the present invention.

In still other embodiments, the radial grooves need not follow exact radial lines; some or all of the grooves can start near the center and extend to the edge in a non-radial direction. For example, FIG. 9 is a simplified top view of an MCPCB 900 according to another embodiment of the present invention. As shown, MCPCB 900 provides a large circular metal plate 902 with nearly radial grooves 904-909 that have inner ends disposed near (but displaced from) the center and that have outer ends at the peripheral edge. Each groove is oriented at an angle to the radial direction.

Figure 10:
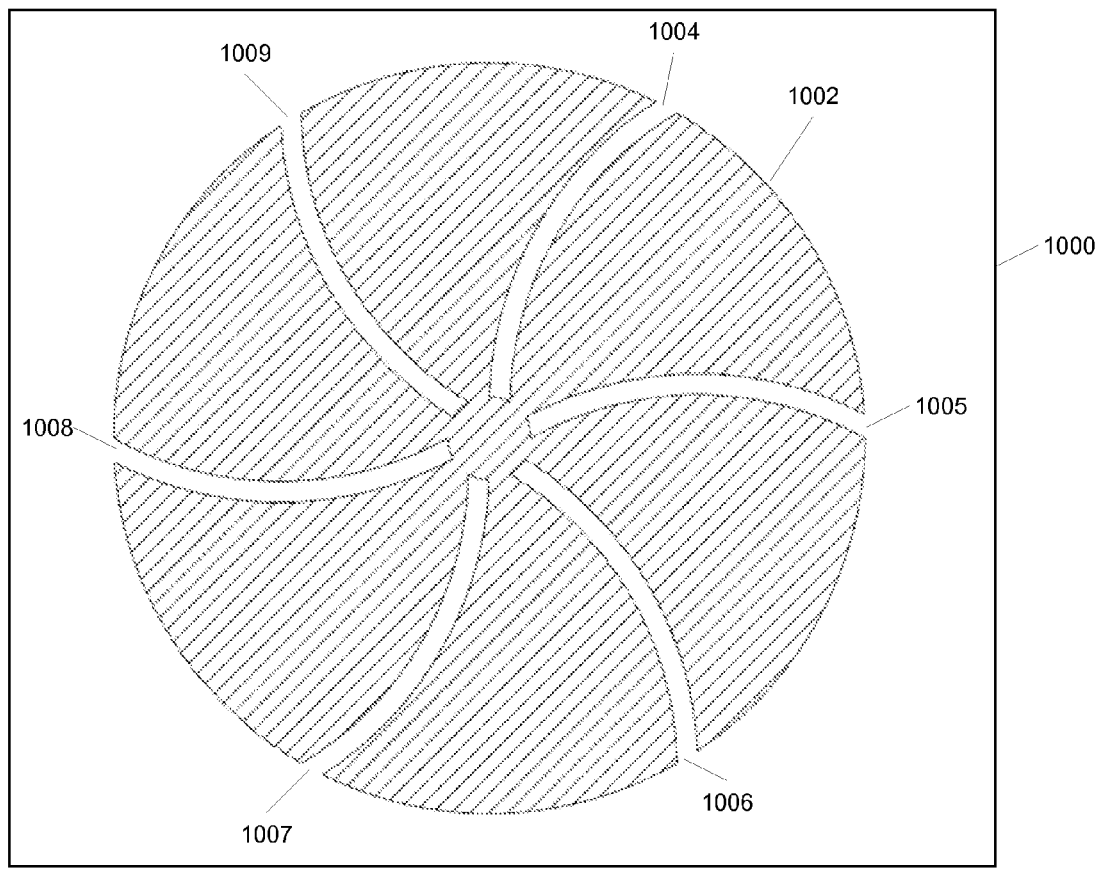
FIG. 10 is a simplified top view of an MCPCB according to another embodiment of the present invention.

In still other embodiments, the radial grooves need not be straight; some or all of the grooves can be curved. For example, FIG. 10 is a simplified top view of an MCPCB 1000 according to another embodiment of the present invention. As shown, MCPCB 1000 provides a large circular metal plate 1002 with curved radial grooves 1004-1009 that have inner ends disposed near (but displaced from) the center and that have outer ends at the peripheral edge. Each groove has a curving path from the inner end to the outer end.

Any of the above or other grooved plates can be used to implement plate 122 of FIG. 1. In other embodiments, radial grooves can be formed on metal plate 108 of emitter 101 rather than on MCPCB plate 122. For example, in the case of a copper-based MCPCB, it may be desirable to form grooves on the emitter plate. In general, any of the emitter plate, the MCPCB plate, or both plates can have radial grooves (which may be exactly or generally radial) as described herein.

To bond the emitter to the MCPCB, conventional soldering processes can be used. For example, in a reflow process, a solder paste (generally containing powdered solder and flux) is applied to the top surface of plate 122 of MCPCB 102 and/or to the bottom surface of plate 108. It is not necessary to pay particular attention to grooves 124 when applying the solder paste. The parts are then placed in contact in the desired alignment. The assembly is placed in an oven or on a hot plate and heated at controlled temperatures to reflow the solder, thus forming solder bond 126. A particular temperature/time profile is not critical to the present invention; conventional processes can be used.

While the invention has been described with respect to specific embodiments, one skilled in the art will recognize that numerous modifications are possible. For instance, in the embodiments shown herein, the metal plates are circular (within manufacturing tolerances); however, other shapes might also be used. For example, the plates can be elliptical or polygonal (with rounded or sharp corners), and "radial" grooves can begin near the center and extend toward the peripheral edge of a circular, elliptical or polygonal shape. The number of grooves can be varied from that shown, and none, some, or all of the grooves may meet in or near the center of the plate. The inner ends of different grooves can be at different distances from the center. The examples shown herein have arrangements of grooves with circular symmetry (e.g., fourfold or sixfold); however, it is not required that the arrangement of grooves be symmetric. In addition, the width of a groove can be varied along its length, and different grooves can have different widths.

In addition, in the foregoing examples, grooves are formed in the metal plate on the top surface of the MCPCB. In other embodiments, grooves can be formed in the metal plate on the bottom surface of the emitter substrate rather than on the top surface of the MCPCB. As noted above, the metal plates on the emitter and the MCPCB in a given light source assembly can have the same size and shape; accordingly, any of the patterns described above for MCPCBs can be used as groove patterns on the metal plate of an emitter. Other patterns can also be used. In still other embodiments, grooves can be formed on both plates (i.e., on MCPCB and on the emitter substrate). The grooves can be arranged such that grooves on one plate do not align with grooves on the other plate when the plates are soldered together, in order to reduce the variations in solder thickness due to the presence of grooves.

Thus, although the invention has been described with respect to specific embodiments, it will be appreciated that the invention is intended to cover all modifications and equivalents within the scope of the following claims.

What is claimed is:

1. A printed circuit board for bonding to an emitter substrate supporting light emitting devices, the printed circuit board comprising:
a first insulating layer; and
a metal plate on a top surface of the first insulating layer, the metal plate having a plurality of grooves therein, wherein at least some of the grooves have an inner end at a first distance from a center of the metal plate and an outer end at a peripheral edge of the metal plate, wherein the at least some of the grooves have a uniform depth from the inner end to the outer end, the uniform depth being at least equal to a thickness of the metal plate such that a portion of the first insulating layer is exposed at a bottom of the groove.

2. The printed circuit board of claim 1 further comprising:
a second insulating layer parallel to and below the first insulating layer; and
at least one patterned layer of conductive material disposed between a bottom surface of the first insulating layer and a top surface of the second insulating layer.

3. The printed circuit board of claim 2 further comprising:
a plurality of metal contact pads disposed on the top surface of the first insulating layer,
wherein at least one of the plurality of metal contact pads is electrically connected to the conductive material of the patterned layer.

4. The printed circuit board of claim 1 wherein the metal plate is circular.

5. The printed circuit board of claim 1 wherein the first distance is zero.

6. The printed circuit board of claim 1 wherein the first distance is greater than zero.

7. The printed circuit board of claim 1 wherein the plurality of grooves further includes at least one groove having an inner end at the center of the metal plate and an outer end at a second distance from the center, wherein the second distance is less than a distance from the center of the metal plate to the peripheral edge of the metal plate.

8. The printed circuit board of claim 7 wherein the second distance is equal to the first distance.

9. The printed circuit board of claim 7 wherein the second distance is less than the first distance.

10. The printed circuit board of claim 1 wherein respective outer ends of all of the plurality of radial grooves are at the peripheral edge of the metal plate.

11. The printed circuit board of claim 1 wherein the number of grooves and width of each groove is selected such that an area occupied by the grooves is less than 15% of a total area of the metal plate.

12. The printed circuit board of claim 1 wherein the at least some of the plurality of grooves each have a width that is uniform along a length of the groove.

13. An emitter for a light emitting device, the emitter comprising:

an emitter substrate having a top surface adapted to support a plurality of light emitting diodes and a bottom surface; and a metal plate disposed on the bottom surface of the emitter substrate, the metal plate having a plurality of grooves therein, wherein at least some of the grooves have an inner end at a first distance from a center of the metal plate and an outer end at a peripheral edge of the metal plate, wherein the at least some of the grooves have a uniform depth from the inner end to the outer end, the uniform depth being at least equal to a thickness of the metal plate such that a portion of the first insulating layer is exposed at a bottom of the groove.

14. The emitter of claim 13 wherein the metal plate is circular.

15. The emitter of claim 13 wherein the first distance is zero.

16. The emitter of claim 13 wherein the first distance is greater than zero.

17. The emitter of claim 13 wherein the plurality of grooves further includes at least one groove having an inner end at the center of the metal plate and an outer end at a second distance from the center, wherein the second distance is less than a distance from the center of the metal plate to the peripheral edge of the metal plate.

18. The emitter of claim 13 wherein the number of grooves and width of each groove is selected such that an area occupied by the grooves is less than 15% of a total area of the metal plate.

19. The emitter of claim 13 wherein the at least some of the plurality of grooves each have a width that is uniform along a length of the groove.

20. A light emitting device comprising:

a printed circuit board having a first insulating layer and a first metal plate on a top surface of the first insulating layer;

an emitter substrate having a top surface holding a plurality of light emitting diodes and a bottom surface having a second metal plate thereon; and a solder layer disposed between and bonded to the first metal plate and the second metal plate, wherein the first metal plate has a plurality of grooves therein, wherein at least some of the grooves have an inner end at a first distance from a center of the first metal plate and an outer end at a peripheral edge of the first metal plate, wherein the at least some of the grooves have a uniform depth from the inner end to the outer end, the uniform depth being at least equal to a thickness of the metal plate such that a portion of the first insulating layer is exposed at a bottom of the groove, wherein a solder material of the solder layer fills in the plurality of grooves.

21. The light emitting device of claim 20 wherein the first and second metal plates are circular.

22. The light emitting device of claim 20 wherein the first distance is zero.

23. The light emitting device of claim 20 wherein the plurality of grooves further includes at least one groove having an inner end at the center of the metal plate and an outer end at a second distance from the center, wherein the second distance is less than a distance from the center of the metal plate to the peripheral edge of the metal plate.

24. The light emitting device of claim 20 wherein respective outer ends of all of the plurality of radial grooves are at the peripheral edge of the metal plate.

25. The light emitting device of claim 20 wherein the number of grooves and width of each groove is selected such that an area occupied by the grooves is less than 15% of a total area of the metal plate.

26. The light emitting device of claim 20 wherein the at least some of the plurality of grooves each have a width that is uniform along a length of the groove.

* * * * *